(12) United States Patent
Belgal et al.

(10) Patent No.: US 8,954,650 B2
(45) Date of Patent: Feb. 10, 2015

(54) APPARATUS, SYSTEM, AND METHOD FOR IMPROVING READ ENDURANCE FOR A NON-VOLATILE MEMORY

(75) Inventors: Hanmant P. Belgal, El Dorado Hills, CA (US); Ning Wu, Folsom, CA (US); Paul D. Ruby, Folsom, CA (US); Andrew Vogan, Aloha, OR (US); Xin Guo, San Jose, CA (US); Ivan Kalastirsky, Folsom, CA (US); Mase J. Taub, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 817 days.

(21) Appl. No.: 13/234,446

(22) Filed: Sep. 16, 2011

(65) Prior Publication Data

US 2013/0073786 A1 Mar. 21, 2013

(51) Int. Cl.
*G06F 12/00* (2006.01)
*G06F 12/02* (2006.01)
*G11C 16/04* (2006.01)
*G11C 16/34* (2006.01)

(52) U.S. Cl.
CPC ........ *G06F 12/0246* (2013.01); *G11C 16/0483* (2013.01); *G11C 16/3422* (2013.01); *G06F 2212/7205* (2013.01)
USPC .......................................................... 711/103

(58) Field of Classification Search
None
See application file for complete search history.

(56) References Cited

U.S. PATENT DOCUMENTS

| 8,238,157 | B1 * | 8/2012 | Sommer et al. | 365/185.03 |
| 8,743,615 | B2 * | 6/2014 | Lee et al. | 365/185.18 |
| 2012/0268990 | A1 * | 10/2012 | Sommer et al. | 365/185.03 |
| 2013/0051148 | A1 * | 2/2013 | Lee et al. | 365/185.18 |

* cited by examiner

*Primary Examiner* — Brian Peugh
(74) *Attorney, Agent, or Firm* — Blakely, Sokoloff, Taylor & Zafman LLP

(57) ABSTRACT

Described are an apparatus, system, and method for improving read endurance for a non-volatile memory (NVM). The method comprises: determining a read count corresponding to a block of NVM; identifying whether the block of NVM is a partially programmed block (PPB); comparing the read count with a first threshold when it is identified that the block is a PPB; and when identified otherwise, comparing the read count with a second threshold, wherein the first threshold is smaller than the second threshold. The method further comprises: identifying a block that is a PPB; determining a first word line corresponding to un-programmed page of the PPB; and sending the first word line to the NVM, wherein the NVM to apply: a first read voltage level to word lines corresponding to the un-programmed pages of the PPB, and a second read voltage level to word lines corresponding to programmed pages of the PPB.

30 Claims, 11 Drawing Sheets

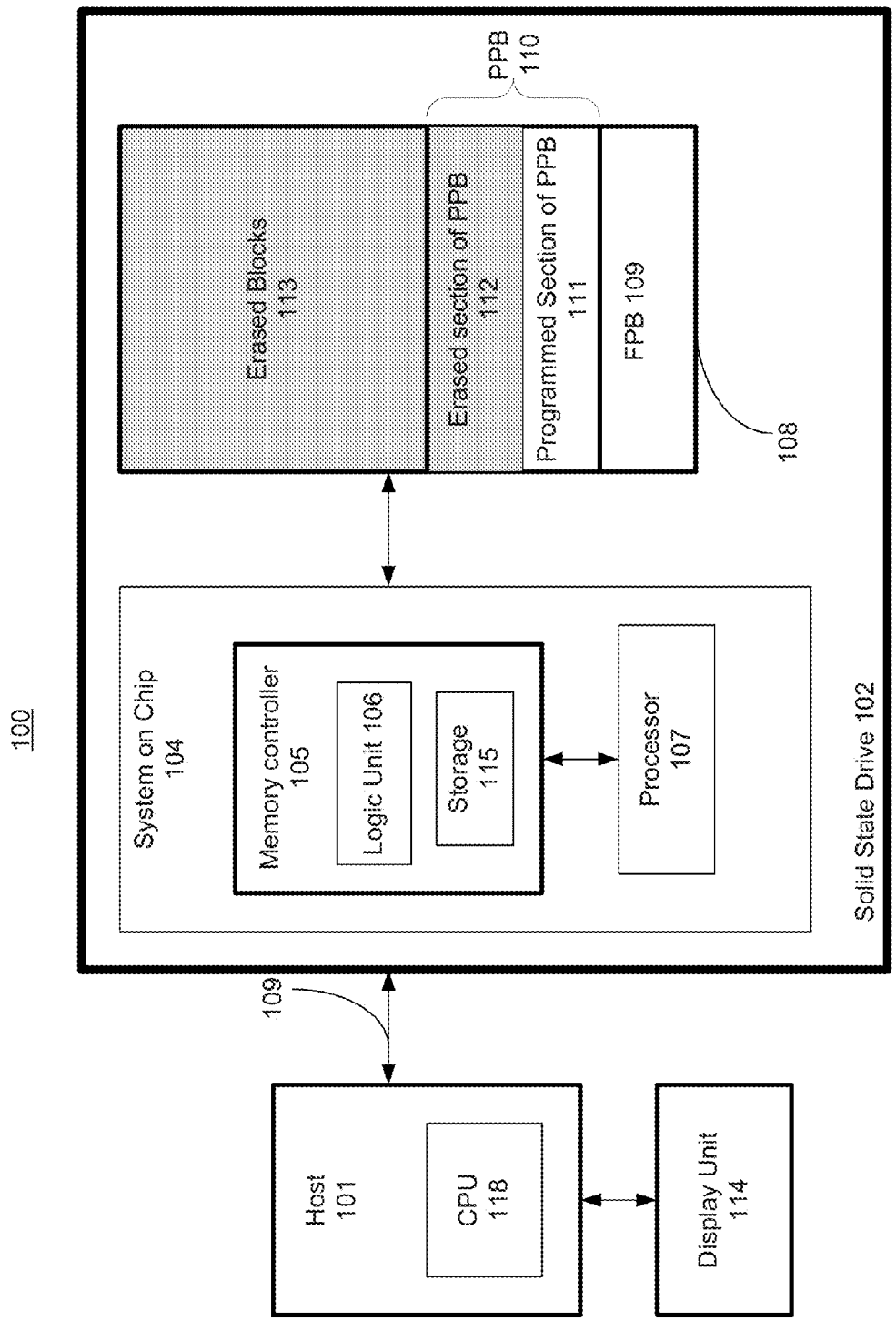

APPARATUS, SYSTEM, AND METHOD FOR IMPROVING READ ENDURANCE FOR A NON-VOLATILE MEMORY

FIELD OF THE INVENTION

Embodiments of the invention relate generally to the field of non-volatile memories. More particularly, embodiments of the invention relate to an apparatus, system, and method for improving read endurance for non-volatile memories.

BACKGROUND

Flash memory (e.g., NAND flash memory) comprises grid of cells arranged in a rectangular lattice. A cell is a floating gate transistor and information in the cell is stored as charge in its floating gate. The stored charge in the floating gate determines the threshold voltage of the cell. A multi-level-cell (MLC) stores more than one bit per cell. Programming of a cell in a flash memory (e.g., NAND flash memory) is attained by Fowler-Nordhiem tunneling to reach an ideal programmed voltage. However, due to programming time constraints, some tolerance is accepted and the actual programmed voltage is allowed to be within some range of the ideal value. A cell is read using a read voltage level. Errors occur during reads because of overlaps of level distributions. If the raw bit error rate (RBER) has to be kept low, the level distributions must be narrow.

However, level distributions broaden due to capacitive coupling between neighboring cells. This phenomenon is called inter-cell-interference (ICI) caused by floating-gate to floating-gate coupling. ICI can be from mild to extreme. Due to capacitive coupling between neighboring cells of the Flash, threshold voltage of the cells is disturbed. The threshold voltage of the cell depends on the coupling with the neighboring cells and their charge. The capacitive coupling causes the level distribution for multi-level cells (MLC) to broaden, effectively increasing the RBER.

As flash memories (e.g., NAND flash memory) are read repeatedly, the threshold voltages of the cells in the flash memories get disturbed. This disturbance caused by the read operation is also referred to as "read disturb stress" (RDS). Both erased cells (cells that are not written yet and store '1' data) and the cells that are read suffer from RDS. The direction of threshold voltage shift due to RDS is generally from lower threshold voltage level to higher threshold voltage level.

When a particular page in a block of cells of the flash memory is read, i.e. a word line coupled to the page is selected, RDS also occurs on cells coupled to the unselected word lines. RDS can cause an incorrect read of data because of shifting/disturbance of the threshold voltage levels of the cells in the block of cells of the flash memory. An incorrect read causes an increase in RBER. If RBER exceeds a certain threshold value, error correction code (ECC) results in failures. Furthermore, RDS can also cause misplacement failures in MLC. The problem of RDS is further amplified when the effects of RDS are combined with ICI in blocks of memories which are partially programmed.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 1 is a high level system with logic to improve read endurance for a non-volatile memory (NVM), according to one embodiment of the invention.

DETAILED DESCRIPTION

Figure 2A:
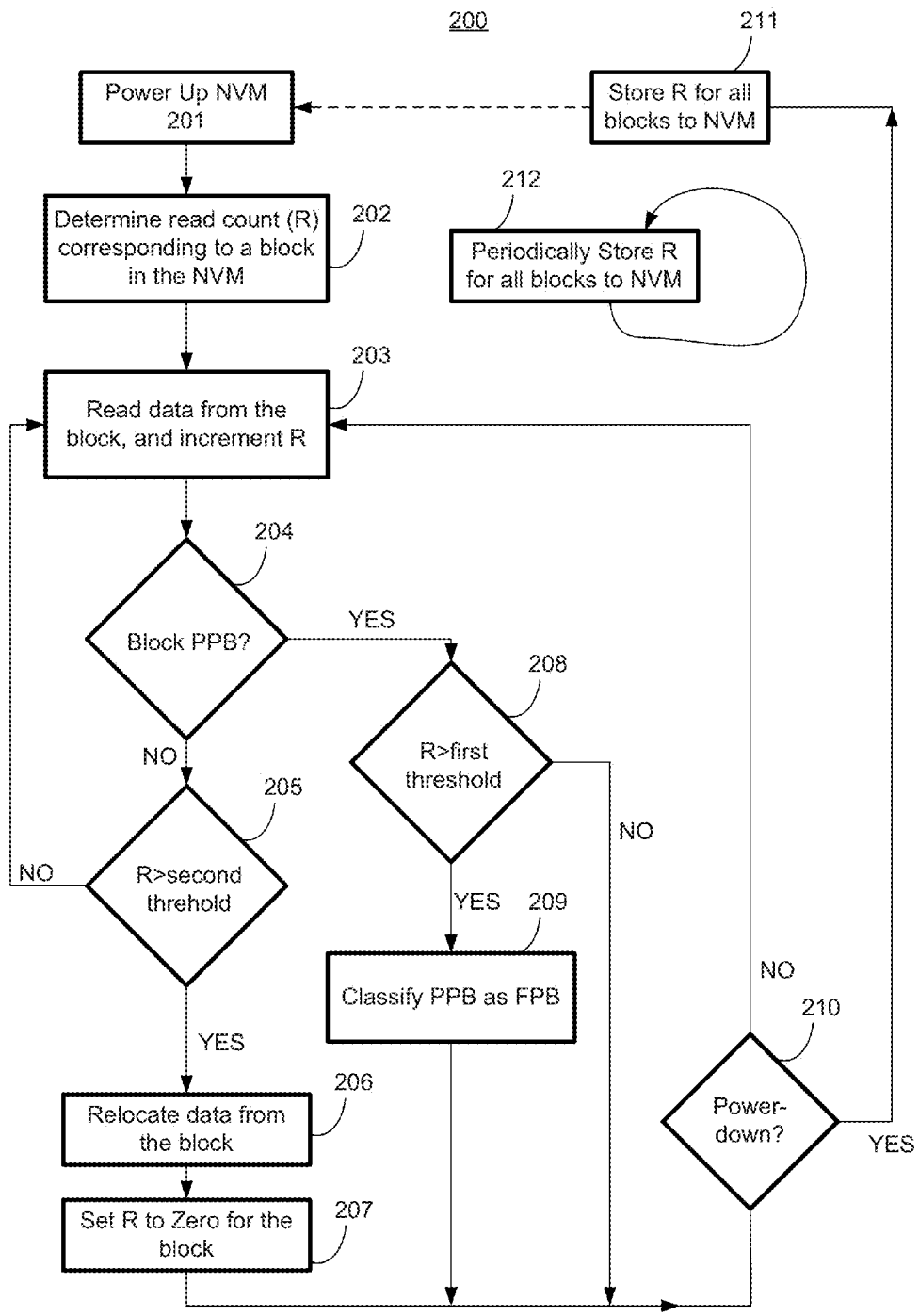
FIG. 2A is a flowchart illustrating a method to improve read endurance for a NVM, according to one embodiment of the invention.

Embodiments of the invention relate to apparatus, system, and method for improving read endurance for non-volatile memories. In one embodiment, the method comprises determining a read count corresponding to a block of non-volatile memory (NVM); identifying whether the block of NVM is a partially programmed block (PPB); comparing the read count with a first threshold when it is identified that the block is a PPB; and when identified otherwise, comparing the read count with a second threshold, wherein the first threshold is smaller than the second threshold.

The term "partially programmed block (PPB)" herein refers to a block of NVM having pages that are programmed and pages that are still in erased state, i.e. only some pages in the block have been written to.

The term "fully programmed block (FPB)" herein refers to a block of NVM having pages which are all programmed, i.e. all the pages in the block have been written to.

The read count is incremented on every read operation. In one embodiment, when the read count is greater than the first threshold, PPB is classified as a fully programmed block (FPB) and so all future write requests to the block are stopped. In one embodiment, when the read count is greater than the second threshold, the read count for the block is incremented and the data in the block is relocated to a new location.

The technical effect of using two thresholds, one for PPB and one for FPB, improves read endurance of the blocks of NVM and improves the RBER which would otherwise degrade due to RDS.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 is a high level system 100 with logic to improve read endurance for a NVM, according to one embodiment of the invention. In one embodiment, the system 100 comprises a host 101 coupled to a display 114, and a memory 102. In one embodiment, the memory 102 comprises a system on chip (SOC) 104 including a memory controller 105 with a logic unit 106 which is operable to improve read endurance for the NVM 108 and a storage unit 115 to store machine-executable instructions, and a processor 107 coupled to the memory controller 105. In one embodiment, the SOC 104 includes other components e.g., wireless antenna, memory, etc.

In one embodiment, the host 101 comprises a processor 118 and other components (e.g., chipset). In one embodiment, the processor 118 is a microprocessor designed and/or manufactured by INTEL CORPORATION of Santa Clara, Calif. In one embodiment, the processor 107 is one of an ATOM™ processor, CORE™ i3, i5, i7 processors manufactured by INTEL CORPORATION. In one embodiment, the processor 118 is an ARM™ processor, or any low power processor.

In one embodiment, the SOC 104 communicates with the host 101 via a bus 109. In one embodiment, the bus 109 is one of a Serial Advance Technology Attachment (SATA) input-output (I/O) bus or a Serially Attached Small System Computer (SAS) input-output (I/O) bus. In one embodiment, other types of buses (e.g., Universal Serial Bus (USB), Peripheral Component Interconnect Express (PCI Express)) can be used for bus 109 without changing the essence of the embodiments discussed herein.

In one embodiment, the SOC 104 and the NVM 108 is part of a solid state drive (SSD) 102. In one embodiment, the SSD 102 is positioned inside a personal computer, a tablet, a smart phone (also referred to as a smart device), etc. In one embodiment, the memory controller 105 and/or the SOC 104 is a standalone integrated circuit coupled to the host 101 and the NVM 108. In other embodiments, the memory controller 105 and/or the SOC 104 is integrated in the host 101. In one embodiment, the display unit 114 is a touch pad display which is operable to communicate with the SSD 102 via the host 101. While the SOC 104 in FIG. 1 is shown with all components integrated together, the components 115, 105, 106, and 107 may be discrete components, according to one embodiment.

In one embodiment, the NVM 108 is a NAND flash memory. In one embodiment the non-volatile memory 108 is a NOR flash memory. In one embodiment, the non-volatile memory 108 is one of a phase change memory (PCM), stacked PCM (PCMS, also referred to as PCM and switch), read-only memory (ROM), electrically erasable programmable read-only memory (EEPROM), or any other type of non-volatile memory device. In one embodiment, 102 is a removable drive e.g., a Universal Serial Bus (USB) memory stick, flash card, etc. In other embodiments, other forms of non-volatile memories may be used that suffer from RDS. So as not to obscure the embodiments of the invention, the NVM 108 discussed herein is a NAND flash memory.

As mentioned above other forms of non-volatile memories may be used, that suffer from RDS, without changing the essence of the embodiments. The embodiment of the NVM 108 illustrates three different types of blocks of memory—a FPB 109, PPB 110, and erased blocks 113. In one embodiment, the PPB 110 includes a programmed section 111 and an erased section 112.

In one embodiment, the memory controller 105 keeps track of the number of reads made by the host 101 and/or the controller 105 (and/or the SOC 104) to the PPB 110 and the FPB 109. In one embodiment, the first and second thresholds are stored in the storage unit 115 and accessed by the logic unit 106 to determine whether the number of reads to PPB 110 and the FPB 109 cross the first and second thresholds, as discussed below with reference to FIG. 2.

FIG. 2A is a flowchart 200 illustrating a method to improve read endurance for a NVM, according to one embodiment of the invention.

Although the blocks in the flowchart 200 are shown in a particular order, the order of the actions can be modified. Thus, the illustrated embodiments can be performed in a different order, and some actions/blocks may be performed in parallel. Additionally, one or more actions/blocks can be omitted in various embodiments of improving read endurance for the NVM 108. The flow chart of FIG. 2A is illustrated with reference to the embodiments of FIG. 1.

At block 201 the system having the NVM 108 powers up and is ready to read and/or write data to the NVM 108. In one embodiment, upon power up, the logic unit 106 of the memory controller 105 loads a lookup table from the NVM 108. In one embodiment, the lookup table includes read count information corresponding to all blocks of the NVM 108. In one embodiment, the lookup table includes read count information corresponding to only blocks of the NVM 108 which are classified as PPB or FPB.

In one embodiment, the logic unit 106 keeps track of which block in the NVM 108 is a FPB and which is a PPB. In one embodiment, the logic unit 106 keeps track of the above information when the memory controller 105 performs a write and/or read request to the NVM 108.

At block 202, the logic unit 106 determines a read count (R) corresponding to a block of NVM for which there is a read request. In one embodiment, the logic unit 106 parses through the lookup table and identifies the value of 'R' for the block of memory of interest (the one with the read request). At block 203, the memory controller 105 executes the read request and reads the data from the block of NVM. In one embodiment, the value of 'R,' corresponding to the block from which data is read, is incremented by 1 via a counter, At block 204, the logic unit 106 determines whether the block from which data was read is a PPB or an FPB. If a determination is made that the block is a PPB (e.g., PPB 110), then at block 208 the logic unit 106 compares the value of 'R' with the first threshold.

The first threshold corresponds to number of reads allowed for a PPB before RDS, that causes the block to become useless, occurs. The value of the first threshold is determined by monitoring RDS failures for a PPB at various process voltage temperature (PVT) conditions for a particular manufacturing technology of the NVM. The first threshold may also determined by executing reliability tests on the NVM 108.

If the value of R is less than the first threshold, then the PPB is continued to be allowed for future reading and writing. The process then transfers back to block 203. In one embodiment, prior to transferring the process to block 203, the logic unit 106 determines at block 210 whether the SSD 102 is being powered down. If the SSD 102 is being powered down, then at block 211 the logic unit 106 stores all current values of 'R' for all blocks of NVM 108 into a reserved area of the NVM 108. If the SSD 102 is not being powered down, then the logic unit 106 transfers the process to block 203.

If the value of 'R' is greater than the first threshold, then at block 209, the PPB is classified as a FPB. One reason for classifying the PPB as a FPB is to close the block for further writing (as if it is full) so that a different threshold (second threshold) can be used to determine when the block is in danger for RDS level that will render the block useless. In one embodiment, further read operations are allowed on the block (which is now classified as FPB) till the second threshold is reached.

The value of the second threshold is larger than the first threshold because a FPB can sustain more reads than a PPB before the FPB experiences RDS. In one embodiment, the first threshold is 131,072. In one embodiment, the second threshold is 655,360. In other embodiments, other values of the first and second thresholds may be used as long as the second threshold is greater than the first threshold.

In one embodiment, the first and second thresholds are stored in the storage unit 115. In one embodiment, the first and second thresholds are programmable values that can be programmed in the storage unit 115 at the time of manufacturing of the SSD 102. In other embodiments, the first and second thresholds are predetermined values, i.e. constant values stored for that SSD 102. In one embodiment, the first and second thresholds are programmable by the host 101.

In one embodiment, the first and second thresholds are adjustable according to program erase cycles associated with the block of NVM 108. In one embodiment, the RDS degrades as the number of program erase cycles increase. Generally, when the number of program erase cycles increase, fewer read operations are done because most of the time the data is being erased from the blocks or programmed to the blocks. In such a case when program erase cycles are high in number then the first and second thresholds can be increased because fewer read operations are being conducted. By increasing the thresholds, as opposed to keeping them constant when program erase cycles increase for a block, the block can be used for more read operations before it experiences RDS that renders the block useless. In one embodi-ment, when the NVM 108 experiences fewer program erase cycles than normal, or when the NVM 108 is new (un-used), higher values of first and second thresholds can be used.

If at block 204 it is determined that the block being accessed from the NVM is not a PPB, i.e. the block is a FPB, then at block 205 the value of 'R' is compared with the second threshold. If the value of 'R' is less than the second threshold then the block is safe for future reads and so the process transfers to block 203. If the value of 'R' is greater than the second threshold, then at block 206 the memory controller 105 relocates the data from the block to a new block. At block 207, the value of 'R' for both the current block and the new block is reset to zero. During the process discussed above, the logic unit 106 periodically stores the value of 'R' for all blocks to the NVM 108 as shown by block 212. The term "periodically" refers to time periods separated by a fixed duration. In one embodiment, the fixed duration is programmable.

Figure 2B:
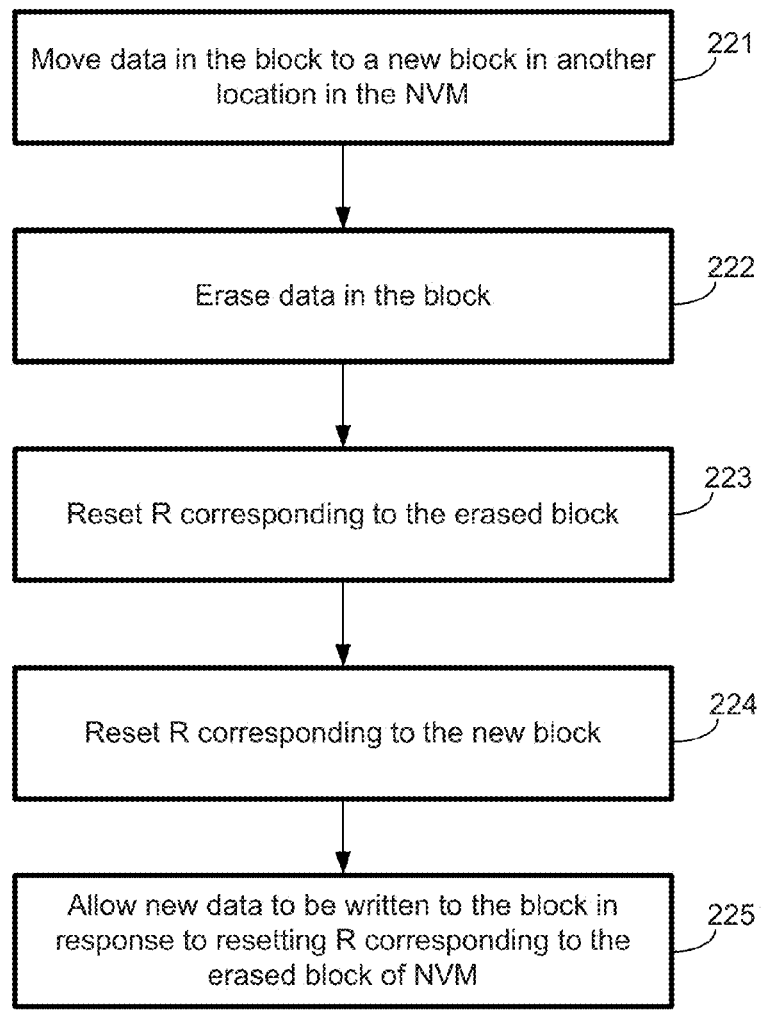
FIG. 2B is a flowchart illustrating a method to relocate data to improve read endurance for a NVM, according to one embodiment of the invention.

FIG. 2B is a flowchart 220 illustrating a method to relocate data to improve read endurance for the NVM 108, according to one embodiment of the invention. The flowchart 220 corresponds to block 206 of FIG. 2A.

Although the blocks in the flowchart 220 are shown in a particular order, the order of the actions can be modified. Thus, the illustrated embodiments can be performed in a different order, and some actions/blocks may be performed in parallel. Additionally, one or more actions/blocks can be omitted in various embodiments of relocating data to improve read endurance for the NVM 108. The flow chart of FIG. 2B is illustrated with reference to the embodiments of FIG. 1 and FIG. 2A.

At block 221, the logic unit 106 instructs the NVM 108 to move the data in the block, for which it is determined that the value of 'R' is greater than the second threshold, to a new block in another location in the NVM 108. At block 222, the logic unit 106 instructs the NVM 108 to erase the data in the original block (data of which is being moved). At block 223, the logic unit 106 resets the value of 'R' to zero for the block which was erased at block 222. At block 224, the logic unit 106 resets the value of 'R' to zero corresponding to the new block. At block 225, the logic unit 106 allows new data to be written to the old block (which is now erased).

Figure 3:
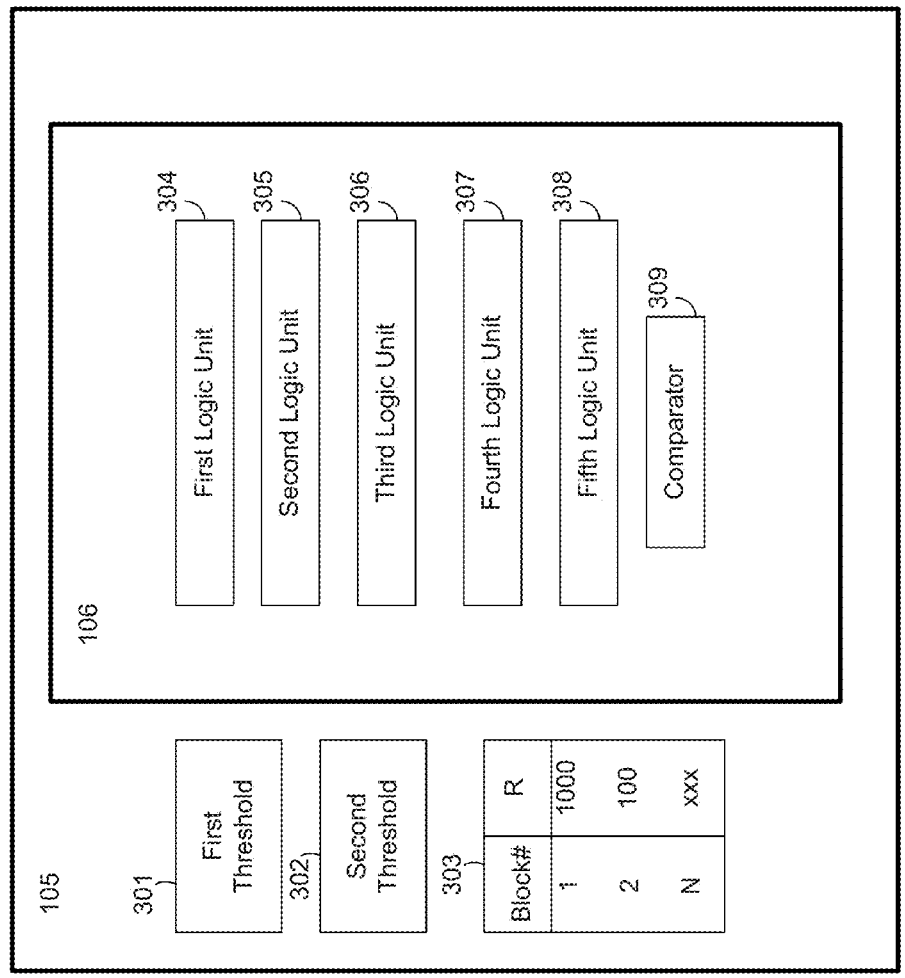
FIG. 3 is a logical view of a memory controller to improve read endurance for a NVM, according to one embodiment of the invention.

FIG. 3 is a logical view 300 of a memory controller 105 to improve read endurance for the NVM 108, according to one embodiment of the invention. The embodiments of 300 are shown with reference to FIGS. 1-2. In one embodiment, the storage unit 115 stores the first threshold 301, second threshold 302, and the lookup table 303. As mentioned above, the lookup table includes the number of 'Rs' for blocks in the NVM 108.

In one embodiment, the logic unit 106 comprises a first logic unit 304 which is operable to determine 'R' corresponding to a block of NVM 108. In one embodiment, the logic unit 106 comprises a second logic unit 305 which is operable to identify whether the block of NVM 108 is a PPB (e.g., PPB 110). In one embodiment, the logic unit 106 comprises a third logic unit 306 which is operable to increment the read count when the read count is less than the first threshold 301, and to increment the read count when the read count is less than the second threshold 302. In one embodiment, the logic unit 106 comprises a fourth logic unit 307 to classify the PPB as a FPB when the read count is greater than the first threshold 301, wherein classifying the PPB as a FPB comprises closing write access to the PPB.

In one embodiment, the logic unit 106 comprises a fifth logic unit 308 to relocate the block to a new location when the read count is greater than the second threshold 302. In one embodiment, the fifth logic unit 308 relocates the block to a new location by: moving the data in the block to a new block in another location in the NVM 108; erasing data in the block of NVM 108; resetting the read count corresponding to the erased block of NVM 108; and resetting the read count corresponding to the new block of the NVM 108.

In one embodiment, the logic unit 106 comprises a comparator 309 to compare the read count with the first threshold when it is identified that the block is a PPB, wherein the comparator to compare the read count with the second threshold when it is identified otherwise, wherein the first threshold is smaller than the second threshold.

Figure 4A:
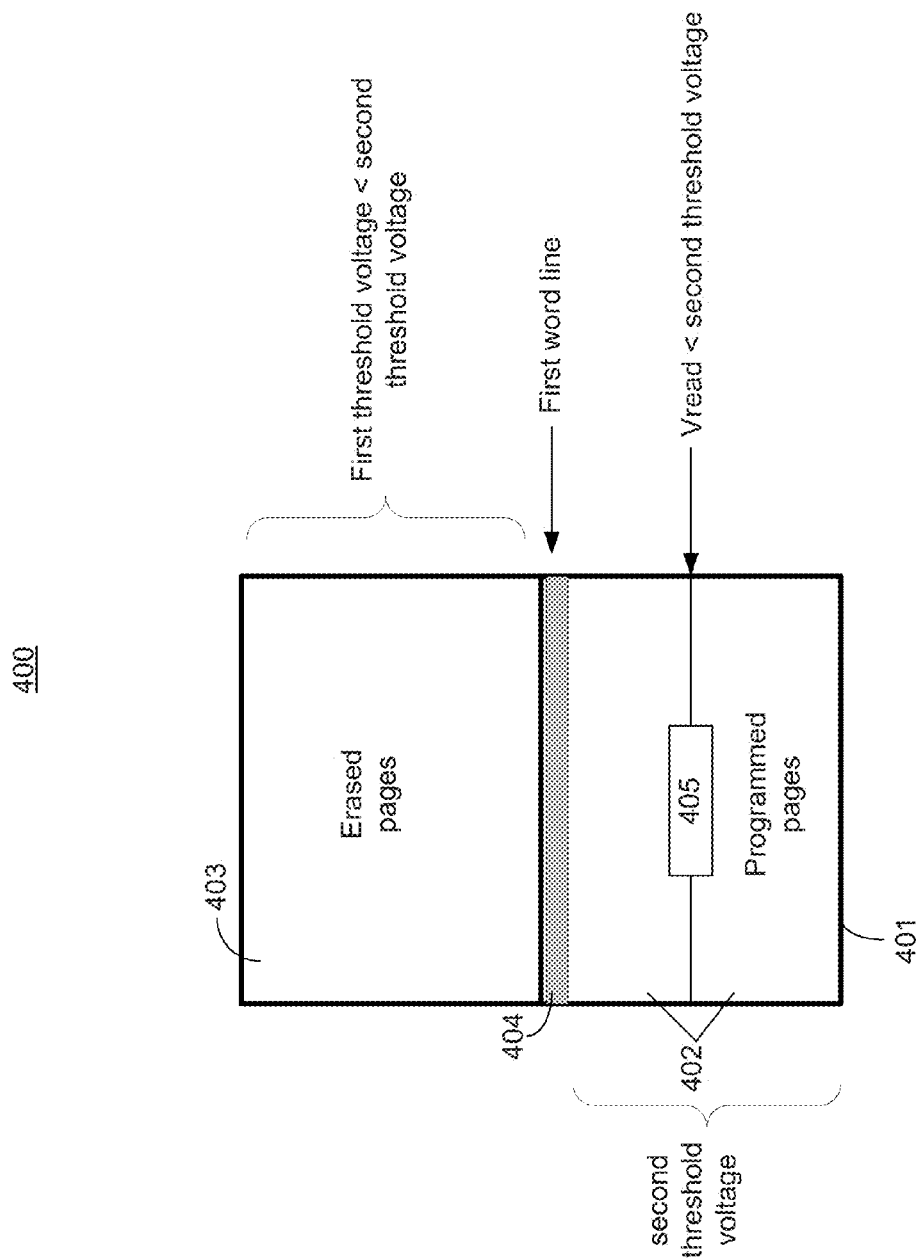
FIG. 4A is a logical view of a NVM with erased pages receiving different voltage than the programmed pages to improve read endurance for the NVM, according to one embodiment of the invention.

FIG. 4A is a logical view 400 of a NVM 108 with erased pages 403 receiving different voltage levels than the programmed pages 402 to improve read endurance for the NVM 108, according to another embodiment of the invention.

As mentioned in die background section, when a particular page in a block of a NVM is read, RDS happens on cells on the unselected word lines too. The unselected word lines have higher voltage levels applied to them compared to the voltage level on the selected word line for reading. This means that a total number of read operations performed on a block of NVM, whether a read operation is performed on one page or all pages of the block, determines the amount of RDS on the block.

In NAND flash memories for which pages in a block are not allowed to be written out of order, i.e. the pages are only written from page zero to page 'N' (where 'N' is the maximum number of pages in a block) in ascending order, the memory controller 105 keeps track of the last page written in a block and from that information knows that pages, which are numbered above that last written page, are ail erased pages or un-programmed pages in that block, according to one embodiment. While the embodiments herein are discussed with reference to NAND flash memories, other types of non-volatile memories that exhibit RDS can be used without changing the essence of the embodiments.

In one embodiment, the memory controller 105 is operable to send additional instructions to the NVM 108 so that the NVM 108 applies different voltage levels to erased pages 403 of a block relative to the programmed pages 402 of the block of a PPB 401. In one embodiment, the memory controller 105 determines a first word line 404, for a PPB, corresponding to the un-programmed section of the block. The first word line 404 corresponds to the word line above which the word lines correspond to un-programmed (or erased) pages 403 and below which the word lines correspond to programmed pages 402 of a PPB 401.

In one embodiment, the memory controller 105 identifies that the block of memory which is about to be read is a PPB. In one embodiment, the memory controller 105 looks up a page-to-word line mapping table to identify the first word line 404. In one embodiment, the memory controller 105 knows the page number of the last page it wrote to, and uses this page number to determine the first word line corresponding to the un-programmed pages. The word line that separates the pages that are programmed from pages that are un-programmed is the first word line 404. In one embodiment, the memory controller 105 receives a SET FEATURE command from the host 101 prior to the read operation on a block of NVM 108. In one embodiment, the SET FEATURE command informs the memory controller 105 that the block which is about to be read is a PPB 401 and the first word line 404. The memory controller 105 then instructs the NVM 108 to apply a first threshold voltage level to the word lines above the first word line 404, and further instructs the NVM 108 to apply a second threshold voltage level to the word lines below the first word line 404, where the first threshold voltage level is less that the second threshold voltage level, and where the second threshold voltage level is greater than the read voltage level (voltage level applied to the page 405 being read).

The technical effect of applying different voltage levels to programmed and un-programmed pages of a PPB is that the RDS effects are mitigated from the beginning instead of waiting for certain number of read counts made on the PPB after which RDS effects become serious.

The logic units discussed herein with reference to the embodiments of FIGS. 4-6 are different from the logic units discussed with reference to FIG. 3, unless specified otherwise. The first and second threshold voltage levels discussed herein with reference to FIGS. 4-6 are not the same as the first and second thresholds discussed with reference to FIG. 2.

In one embodiment, the memory controller 105 comprises a first logic unit to identify a block that is PPB in the NVM 108. In one embodiment, the first logic unit discussed herein corresponds to the second logic unit 305 of FIG. 3. In one embodiment, the memory controller 105 comprises a second logic unit to determine the first word line 404 corresponding to the first un-programmed page of the PPB 401. In one embodiment, the memory controller 105 comprises a third logic unit to: instruct the NVM 108 to apply a first read voltage level to word lines of the PPB corresponding to the un-programmed pages of the PPB 401; and instruct the NVM 108 to apply a second read voltage level to word lines of the PPB 401 corresponding to programmed pages of the PPB 401, wherein the first read voltage level is lower than the second read voltage level. In one embodiment, the first read voltage level is 5.5V and the second read voltage level is 6.5V. In other embodiments, other voltage levels may be used for first and second read voltage levels.

The term "first read voltage level" and "first threshold voltage" herein are used interchangeably. The term "second read voltage level" and "second threshold voltage" herein are used interchangeably.

Figure 4B:
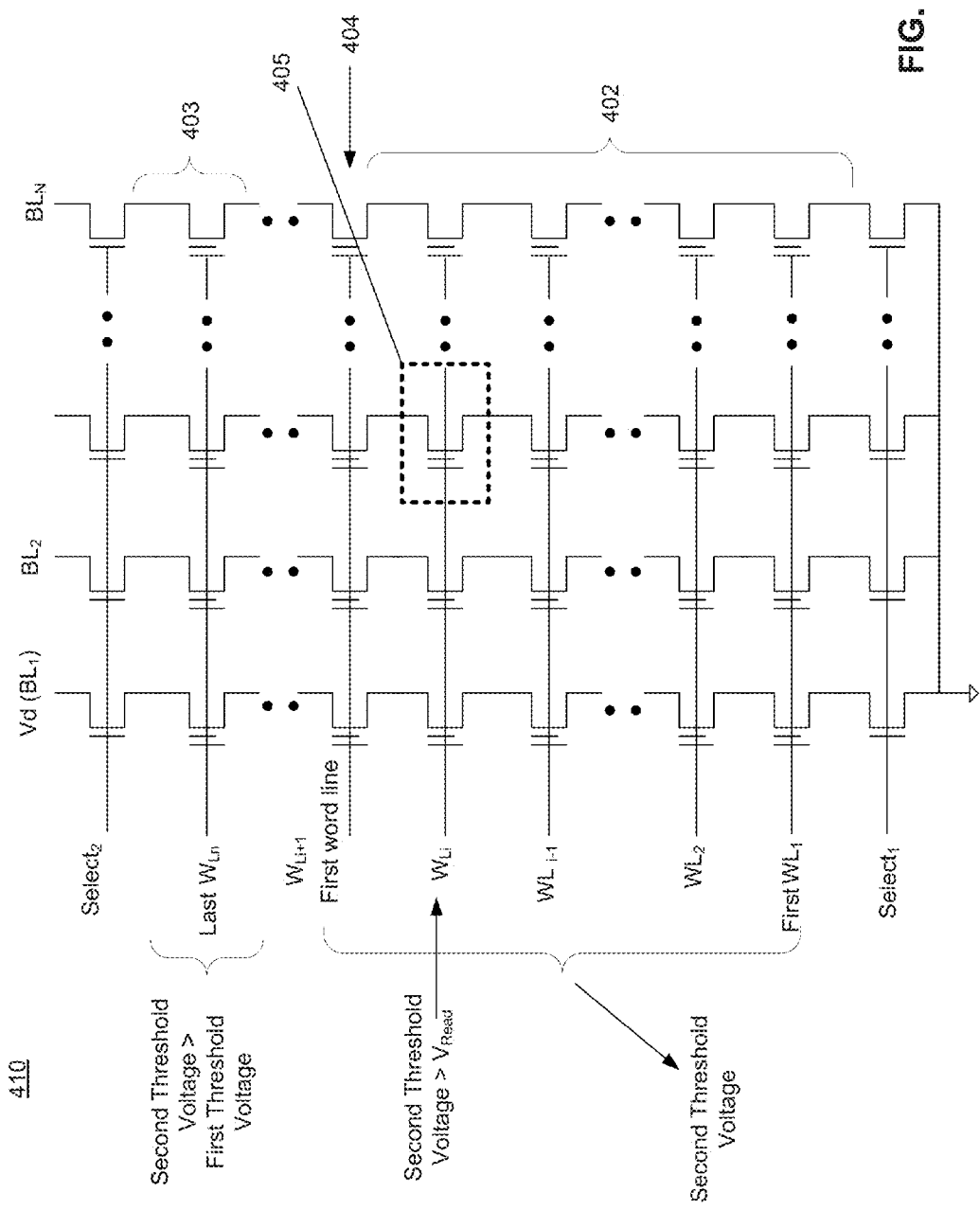
FIG. 4B is a schematic view of a block of NVM with erased pages receiving different voltage than the programmed pages to improve read endurance for the NVM, according to one embodiment of the invention.

FIG. 4B is a schematic view 410 of the block 401 (of FIG. 4A) of NVM 108 with erased pages 403 receiving a different voltage than the programmed pages 402 to improve read endurance for the NVM 108, according to one embodiment of the invention. In this embodiment, the word lines (WL) are numbered from $WL_1$ to $WL_N$. In one embodiment, the transistors connected to the WL signals are the floating gate transistors. In this exemplary embodiment, the first word line 404 ($WL_{i+1}$) indicates that the WL(s) above it are un-programmed VVLs, i.e. $WL_N$. The signals $Select_1$ and $Select_2$ provide bias levels to the gates of the top and bottom CMOS transistors which are connected to BL signals $BL_{1-N}$. In one embodiment, the second threshold voltage is applied to $WL_{1-(Li+1)}$ and the first threshold voltage is applied to $WL_N$, where the second threshold voltage is less than the first threshold voltage. The voltage applied to the WL from which the cell 405 is being read is applied the second threshold voltage which is less than the read voltage level ($V_{read}$).

Figure 5A:
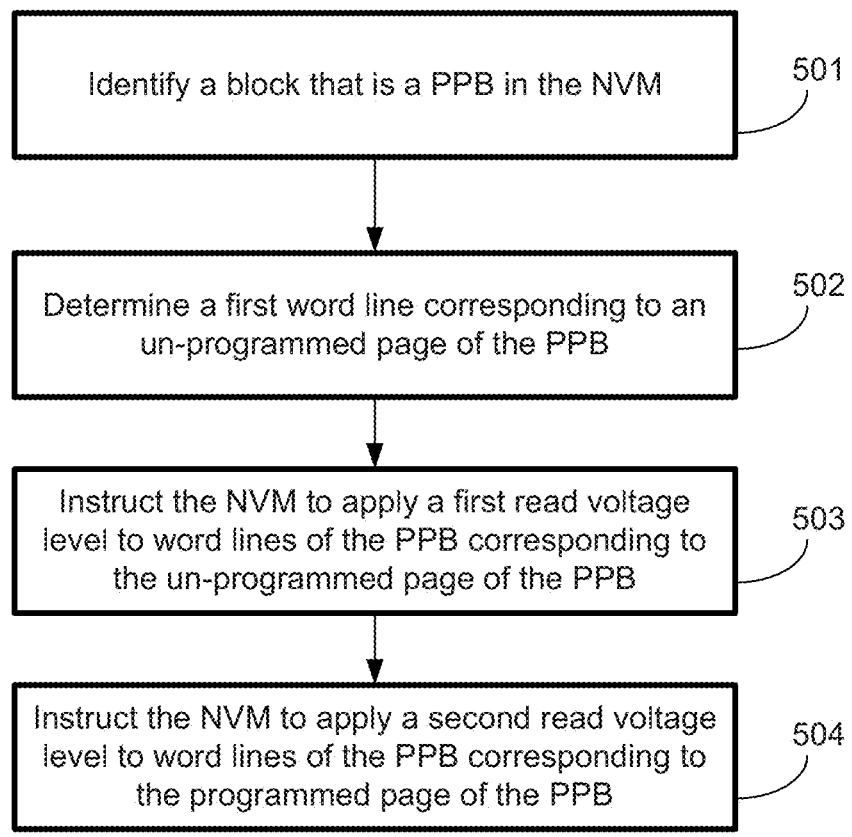
FIG. 5A is flowchart illustrating a method executed by the memory controller to improve read endurance for the NVM, according to one embodiment of the invention.
Figure 5B:
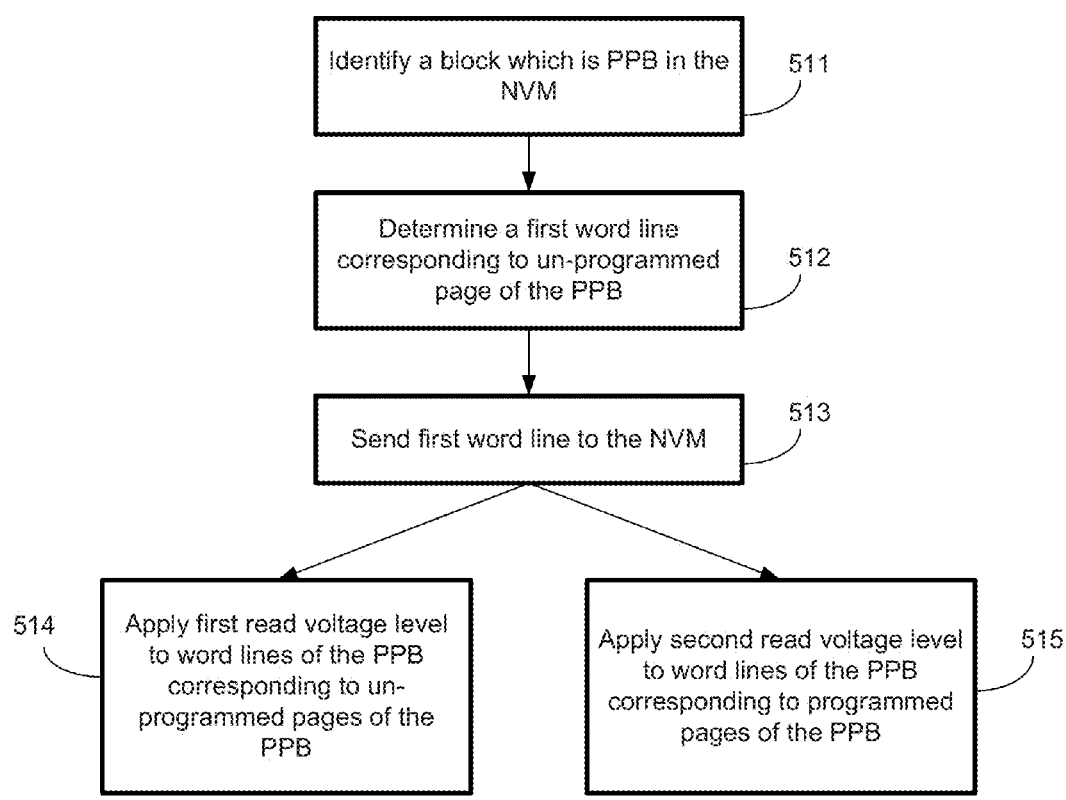
FIG. 5B is flowchart illustrating a method executed by the memory controller and NVM to improve read endurance for the NVM, according to one embodiment of the invention.

FIG. 5A is flowchart 500 illustrating a method executed by the memory controller 105 to improve read endurance for the NVM 108, according to one embodiment of the invention. FIG. 5B is flowchart 510 illustrating a method executed by the memory controller 105 and NVM 601 to improve read endurance for the NVM array 604/108 (FIG. 6A), according to another embodiment of the invention. To better explain the flowcharts 500 and 510, FIGS. 6A-B are described first.

Figure 6A:
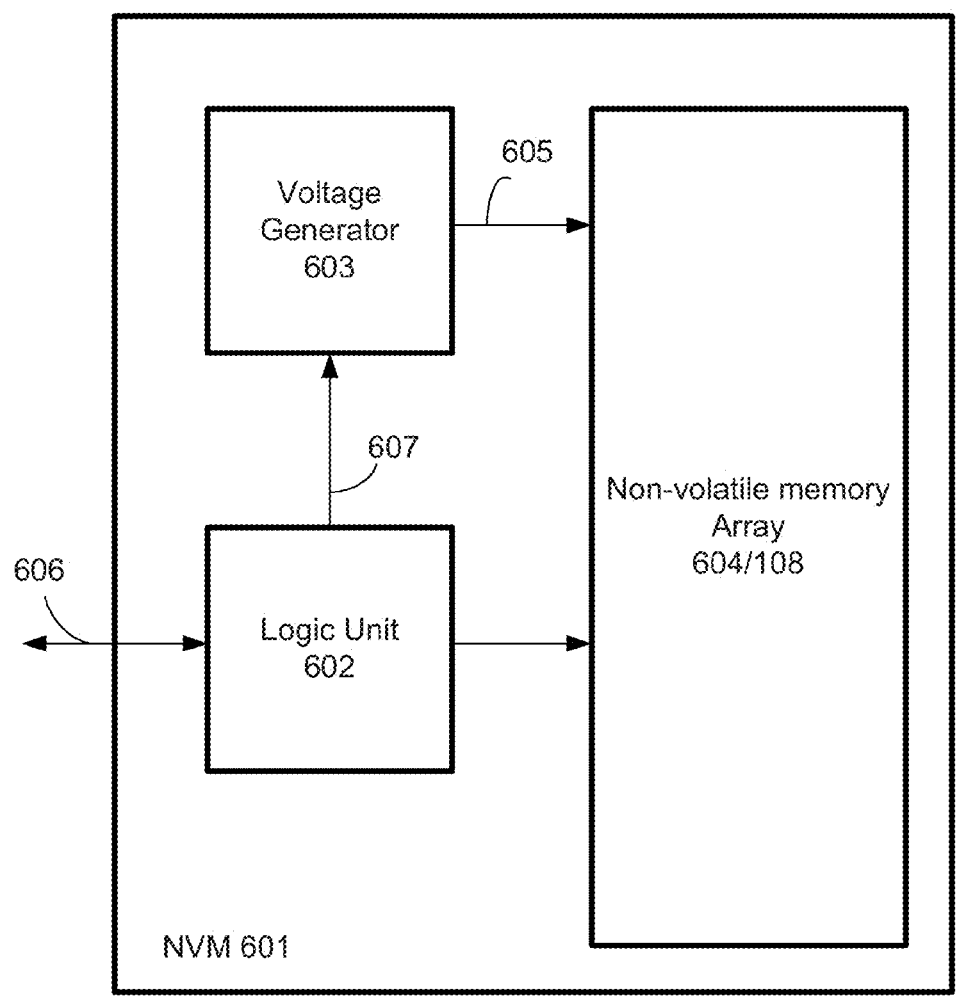
FIG. 6A is a logical view of a NVM with a voltage generator and a logic unit to improve read endurance for the NVM, according to one embodiment of the invention.
Figure 6B:
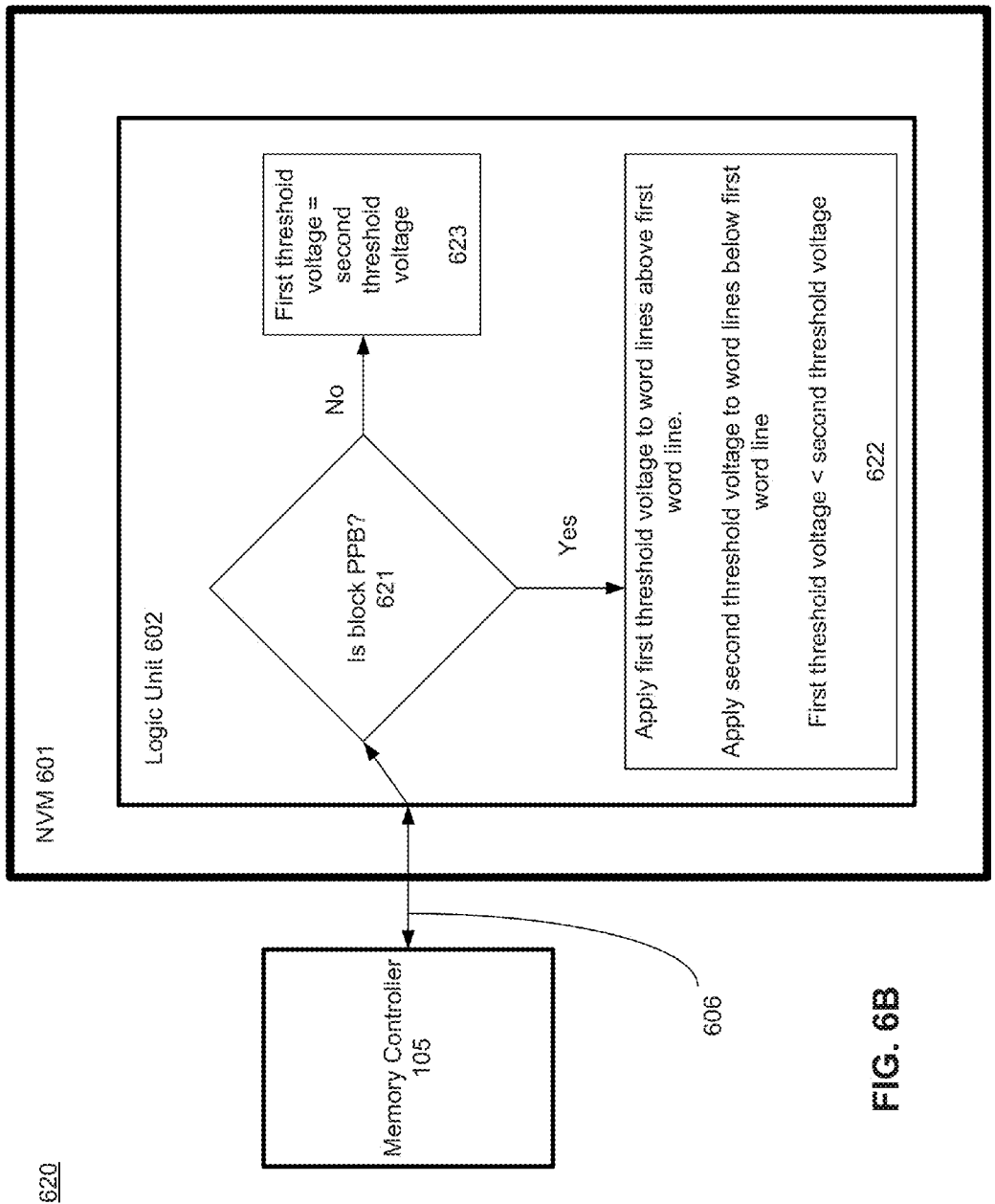
FIG. 6B is a logical view of a NVM comprising the logic unit to improve read endurance for the NVM, according to one embodiment of the invention.

FIG. 6A is a logical view 600 of a NVM 601 with a voltage generator 603 and a logic unit 602 to improve read endurance for the NVM 601, according to one embodiment of the invention. The NVM 601 couples to the memory controller 105 via a bus 606. In one embodiment, the NVM 601 is part of a SSD.

In one embodiment, the third logic unit (as discussed with reference to FIG. 4A) of the memory controller 105 is operable to send the first word line 404 to the NVM array 604/108. In one embodiment, the logic unit 602 receives first word line 404 from the memory controller 105 and determines what voltage levels 605 to select for different word lines of the NVM array 604/108. In one embodiment, the logic unit 602 sends a control signal 607 to the voltage generator 603, where the control signal 607 is used to select one or more voltage levels from the voltage generator 603 for various word lines of the NVM array 604/108. In one embodiment, the voltage generator 603 is a resistor divider network with taps for selection by the control signal 607, where the taps provide different voltage levels from the resistor divider network. In other embodiments, other forms of voltage generators may be used to provide selectable voltage levels for the NVM array 604/108.

In one embodiment, the voltage generator 603 applies a first read voltage level (part of 605) to word lines of the PPB 401 corresponding to the un-programmed (interchangeably referred to as erased) pages 403 of the PPB 401. In one embodiment, the voltage generator 603 applies a second read voltage level (part of 605) to word lines of the PPB 401 corresponding to the programmed pages 402 of the PPB 401, wherein the first read voltage level is lower than the second read voltage level.

FIG. 6B is a logical view 620 of the NVM 601 coupled to the memory controller 105, where die NVM 601 comprises the logic unit 602 to improve read endurance for the NVM, according to one embodiment of the invention. In one embodiment, the memory controller 105 sends a SET FEATURE command and addresses of word lines that are requested for read to the NVM 601. In one embodiment, the SET FEATURE command and the addresses are sent via 606 to the logic unit 602. In one embodiment, the logic unit 602 determines at block 621, according to the SET FEATURE command, whether the block of memory requested for reading is a PPB. If it is determined that the block of memory is not a PPB then the logic unit 602 instructs at block 623 to the voltage generator to send the same voltage level for the first and second threshold voltages for all unselected word lines. If it is determined that the block of memory is a PPB then the logic unit 602 instructs at block 622 to the voltage generator to send the different voltage levels for the first and second threshold voltages so that word lines above the first word line 404 are provided with the first threshold voltage while word lines below the first word line 404 are provided with the second threshold voltage.

Referring back to FIG. 5A, although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments improving read endurance for the NVM 108. The flow chart of FIG. 5A is illustrated with reference to the embodiments of FIG. 1 and FIGS. 4A-B.

At block 501, the memory controller 105 identifies whether a block which is being read or about to being read in the NVM 108 is a PPB 401. This process may be performed by the first logic unit of the memory controller 105 (which corresponds to the second logic unit of FIG. 3). At block 502, the memory controller 105 determines the first word line 404 corresponding to the un-programmed page 403 of the PPB 401. At block 503, the memory controller 105 instructs the NVM 108 to apply a first read voltage level to word lines of the PPB 401 corresponding to the un-programmed pages of the PPB. At block 504, the memory controller 105 instructs the NVM 108 to apply a second read voltage level to word lines of the PPB 401 corresponding to the programmed pages of the PPB 401. The NVM 108 then follows the instructions sent by the memory controller 105 and applies the different voltages to the different pages of the PPB 401.

Referring back to FIG. 5B, although the blocks in the flowchart 510 are shown in a particular order, the order of the actions can be modified. Thus, the illustrated embodiments can be performed in a different order, and some actions/blocks may be performed in parallel. Additionally, one or more actions/blocks can be omitted in various embodiments improving read endurance for the NVM array 604/108. The flow chart of FIG. 5B is illustrated with reference to the embodiments of FIG. 1, FIGS. 4A-B, and FIGS. 6A-B.

At block 511, the memory controller 105 identifies which block in the NVM array 604/108 is a PPB. At block 512, the 105 determines a first word line 404 corresponding to the un-programmed page of the PPB 401. At block 513, the memory controller 105 sends the first word line 404 to the logic unit 602 of the NVM 604/108 via 606. At block 514, the logic unit 602 of the NVM 601 determines what control signal 607 to send to the voltage generator 603 so that the voltage generator applies a first read voltage level to word lines of the PPB 401 corresponding to un-programmed pages of the PPB 401. At block 515, the logic unit 602 of the NVM 601 determines what control signal to send to the voltage generator 603 so that the voltage generator applies a second read voltage level to word lines of the PPB 401 corresponding to programmed pages of the PPB 401, wherein the first read voltage level is lower than the second read voltage level.

Figure 7:
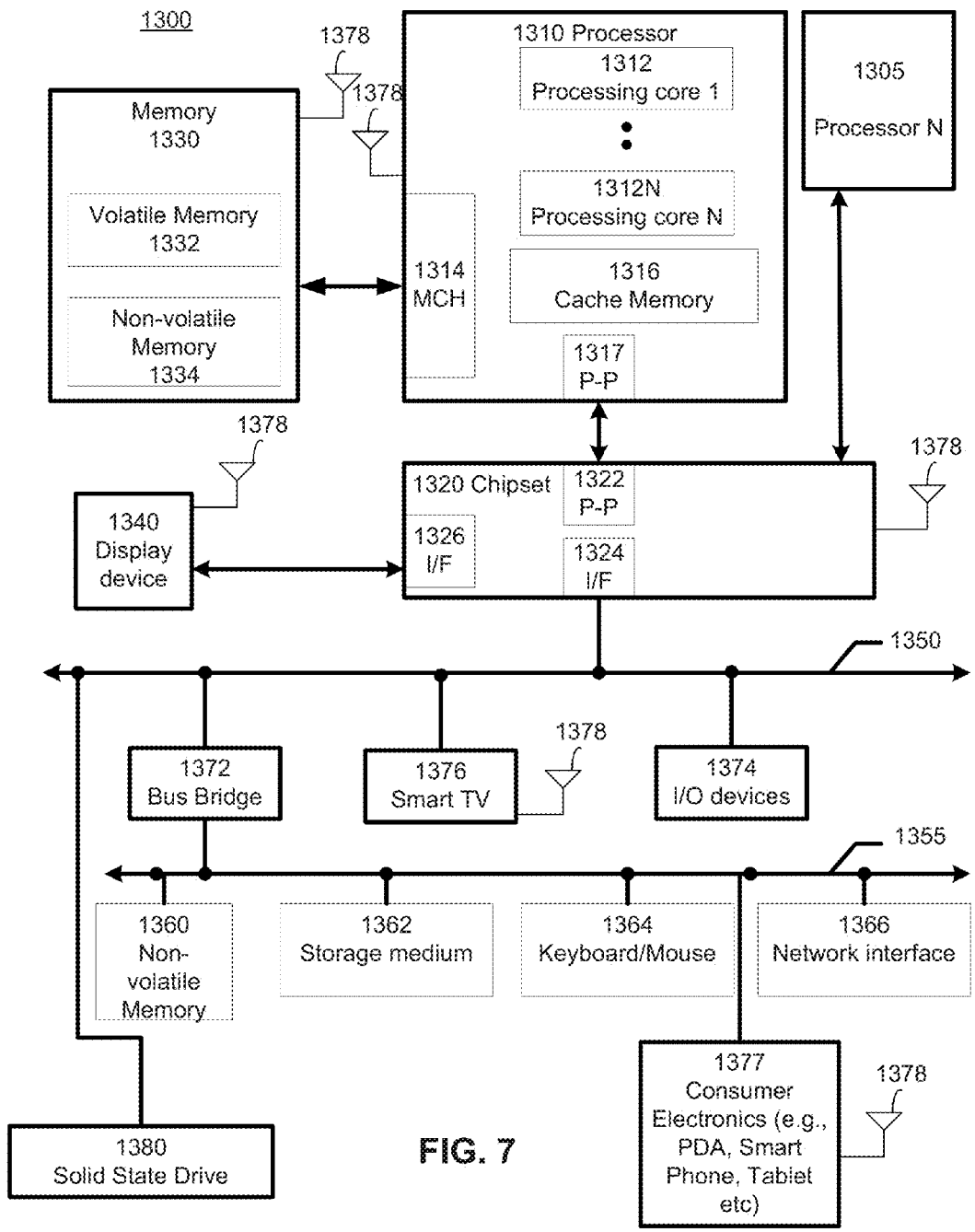
FIG. 7 is a system level diagram comprising a processor and/or memory controller to improve read endurance for the NVM, according to one embodiment of the invention.

FIG. 7 is a system level diagram comprising a processor and/or memory controller to improve read endurance for the NVM, according to one embodiment of the invention. FIG. 7 also includes a machine-readable storage medium to execute computer readable instructions to perform the methods of various embodiments. Elements of embodiments are also provided as a machine-readable medium for storing the computer-executable instructions. In one embodiment, the storage unit 115 of the SOC 104 of the SSD 102 stores the computer executable instructions to implement the flowcharts of FIGS. 2A-B, 5A, 5B. In one embodiment, blocks 514 and 515, and 621-623 may be implemented by executing computer executable instructions stored in the logic unit 602.

The machine-readable medium may include, but is not limited to, flash memory, optical disks, Hard disk drive, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1300 implements the methods disclosed herein and may be a system on a chip (SOC) system.

In one embodiment, the processor 1310 has one or more processer cores 1312 to 1312N, where 1312N represents the Nth processor core inside the processor 1310 where N is a positive integer. In one embodiment, the system 1300 includes multiple processors including processors 1310 and 1305, where processor 1305 has logic similar or identical to logic of processor 1310. In one embodiment, the system 1300 includes multiple processors including processors 1310 and 1305 such that processor 1305 has logic that is completely independent from the logic of processor 1310. In such an embodiment, a multi-package system 1300 is a heterogeneous multi-package system because the processors 1305 and 1310 have different logic units. In one embodiment, the processing core 1312 includes, but is not limited to, pre-fetch logic to fetch instructions, decode logic to decode the instructions, execution logic to execute instructions and the like. In one embodiment, the processor 1310 has a cache memory 1316 to cache instructions and/or data of the system 1300. In another embodiment of the invention, the cache memory 1316 includes level one, level two and level three, cache memory, or any other configuration of the cache memory within the processor 1310.

In one embodiment, processor 1310 includes a memory control hub (MCH) 1314, which is operable to perform functions that enable die processor 1310 to access and communicate with a memory 1330 that includes a volatile memory 1332 and/or a non-volatile memory 1334. In one embodiment, the memory control hub (MCH) 1314 is positioned outside of the processor 1310 as an independent integrated circuit.

In one embodiment, the processor 1310 is operable to communicate with the memory 1330 and a chipset 1320. In one embodiment, the processor 1310 (same as 118 of FIG. 1) and the chipset 1320 are part of the host 101 of FIG. 1. In one embodiment, the chipset 1320 is coupled to a SSD 1380 (same as 102 of FIG. 1) via a SATA bus 1350 (same as bus 109 of FIG. 1). In one embodiment, the SSD 1380 includes machine-readable medium 115 for storing the computer-executable instructions to implement the flowchart of FIG. 2 and FIG. 5. In such an embodiment, a processor in the SSD 1380 executes the computer-executable instructions when the SSD 1380 is powered up.

In one embodiment, the processor 1310 is also coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The NVM 1334 includes, but is not limited to, flash memory (e.g., NAND, NOR), phase change memory (PCM), read-only memory (ROM), electrically erasable programmable read-only memory (EEPROM), or any other type of NVM device.

The memory 1330 stores information and instructions to be executed by the processor 1310. In one embodiment, memory 1330 may also store temporary variables or other intermediate information while the processor 1310 is executing instructions. In one embodiment, chipset 1320 connects with processor 1310 via Point-to-Point (PtP or P-P) interfaces 1317 and 1322. In one embodiment, chipset 1320 enables processor 1310 to connect to other modules in the system 1300. In one embodiment of the invention, interfaces 1317 and 1322 operate in accordance with a PtP communication protocol such as the INTEL® QuickPath Interconnect (QPI) or the like.

In one embodiment, the chipset 1320 is operable to communicate with the processor 1310, 1305, display device 1340, and other devices 1372, 1376, 1374, 1360, 1362, 1364, 1366, 1377, etc. In one embodiment, the chipset 1320 is also coupled to a wireless antenna 1378 to communicate with any device configured to transmit and/or receive wireless signals.

In one embodiment, chipset 1320 connects to a display device 1340 via an interface 1326. In one embodiment, the display 1340 includes, but is not limited to, liquid crystal display (LCD), plasma, cathode ray tube (CRT) display, touch pad display, or any other form of visual display device. In one embodiment of the invention, processor 1310 and chipset 1320 are merged into a single SOC. In addition, the chipset 1320 connects to one or more buses 1350 and 1355 that interconnect various modules 1374, 1360, 1362, 1364, and 1366. In one embodiment, buses 1350 and 1355 may be interconnected together via a bus bridge 1372 if there is a mismatch in bus speed or communication protocol. In one embodiment, chipset 1320 couples with, but is not limited to, a NVM 1360, a mass storage device(s) 1362, a keyboard/mouse 1364, and a network interface 1366 via interface 1324, smart TV 1376, consumer electronics 1377, etc.

In one embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the Institute of Electrical and Electronics Engineers (IEEE) 802.11 standard and its related family, HomePlug AV (HPAV), Ultra Wide Band (UWB), Bluetooth, WiMAX, or any form of wireless communication protocol.

While the modules shown in FIG. 7 are depicted as separate blocks within the system 1300, the functions performed by some of these blocks may be integrated within a single semiconductor circuit or may be implemented using two or more separate integrated circuits. For example, although the cache memory 1316 is depicted as a separate block within the processor 1310, the cache memory 1316 can be incorporated into the processor core 1312 respectively. In one embodiment, the system 1300 may include more than one processor/processing core in another embodiment of the invention.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace ail such alternatives, modifications, and variations as to fall within the broad scope of the appended claims.

We claim:

1. A method comprising:
   identifying whether a block of non-volatile memory (NVM) is a partially programmed block (PPB) based on a read count corresponding to the block of NVM;
   comparing the read count with a first threshold when it is identified that the block is a PPB; and
   when identified otherwise, comparing the read count with a second threshold, wherein the first threshold is smaller than the second threshold.

2. The method of claim 1 further comprises:
   incrementing the read count when the read count is less than the first threshold; and
   classifying the PPB as a fully programmed block (FPB) when the read count is greater than the first threshold.

3. The method of claim 2, wherein classifying the PPB as a FPB comprises closing write access to the PPB.

4. The method of claim 1 further comprises:
   incrementing the read count when the read count is less than the second threshold; and
   relocating the block to a new location when the read count is greater than the second threshold.

5. The method of claim 4, wherein relocating the block comprises:
   moving data in the block to a new block in another location in the NVM;
   erasing the data in the block of NVM;
   resetting the read count corresponding to the erased block of NVM; and
   resetting the read count corresponding to the new block of the NVM.

6. The method of claim 5 further comprises:
   allowing new data to be written to the block in response to resetting the read count corresponding to the erased block of NVM.

7. The method of claim 1, wherein the first and second thresholds are programmable.

8. The method of claim 1, wherein the first and second thresholds are adjusted according to program erase cycles associated with the block of NVM.

9. The method of claim 1 further comprises:
   storing, in the NVM, the read count of the block in response to identifying a power down event.

10. The method of claim 1 further comprises:
    periodically storing the read count of the block in the NVM while the NVM is powered on.

11. The method of claim 1, wherein the NVM is a NAND flash memory.

12. A memory controller comprising:
    a logic unit to identify whether a block of non-volatile memory (NVM) is a partially programmed block (PPB) based on a read count corresponding to the block of NVM; and
    a comparator to compare the read count with a first threshold when it is identified that the block is a PPB, wherein the comparator to compare the read count with a second threshold when it is identified otherwise, wherein the first threshold is smaller than the second threshold.

13. The memory controller of claim 12 further comprises: a third unit to:
    increment the read count when the read count is less than the first threshold; and
    increment the read count when the read count is less than the second threshold; and
    a fourth logic to classify the PPB as a fully programmed block (FPB) when the read count is greater than the first threshold, wherein classifying the PPB as a FPB comprises closing write access to the PPB.

14. The memory controller of claim 13 further comprises a fifth logic to relocate the block to a new location when the read count is greater than the second threshold.

15. The memory controller of claim 14, wherein the fifth logic to relocate the block by executing a process comprising:
    moving data in the block to a new block in another location in the NVM;
    erasing the data in the block of NVM;
    resetting the read count corresponding to the erased block of NVM; and
    resetting the read count corresponding to the new block of the NVM.

16. The memory controller of claim 15 further comprises logic to allow new data to be written to the block in response to resetting the read count corresponding to the erased block of NVM.

17. The memory controller of claim 12, wherein the first and second thresholds are programmable, and wherein the first and second thresholds are adjustable according to program erase cycles associated with the block of NVM.

18. The memory controller of claim 12 further comprises a logic unit to:
    store, in the NVM, the read count of the block in response to identifying a power down event; and
    periodically store the read count of the block in the NVM while the NVM is powered on.

19. The memory controller of claim 12, wherein the NVM is a NAND flash memory.

20. A system comprising:
    a solid state drive (SSD) comprising a controller and a non-volatile memory (NVM), wherein the controller is operable to:
       identify whether a block of NVM is a partially programmed block (PPB) based on a read count corresponding to the block of NVM; and
       compare the read count with a first threshold when it is identified that the block is a PPB; and
       compare the read count with a second threshold when identified otherwise, wherein the first threshold is smaller than the second threshold; and
    a display unit which is operable to display contents from the SSD.

21. The system of claim 20, wherein the controller is operable to:
    increment the read count when the read count is less than the first threshold; and
    increment the read count when the read count is less than the second threshold; and
    classify the PPB as a fully programmed block (FPB) when the read count is greater than the first threshold, wherein classifying the PPB as a FPB comprises closing write access to the PPB.

22. The system of claim 20, wherein the controller is operable to relocate the block to a new location when the read count is greater than the second threshold.

23. The system of claim 20, wherein the controller is operable to:
    move data in die block to a new block in another location in the NVM;

erase the data in the block of NVM;
reset the read count corresponding to the erased block of NVM; and
reset the read count corresponding to the new block of the NVM.

24. The system of claim 23, wherein the controller is operable to allow new data to be written to the block in response to resetting the read count corresponding to the erased block of NVM.

25. The system of claim 20, wherein the first and second thresholds are programmable, and wherein the first and second thresholds are adjustable according to program erase cycles associated with the block of NVM.

26. The system of claim 20, wherein the controller is operable to:
store, in the NVM, the read count of the block in response to identifying a power down event; and
periodically store the read count of the block in the NVM while the NVM is powered on.

27. The system of claim 20, wherein the NVM is a NAND flash memory.

28. An article of manufacture including a machine readable storage medium having processor executable instructions that when executed cause a processor to perform a method comprising:
identifying whether a block of non-volatile memory (NVM) is a partially programmed block (PPB) based on a read count corresponding to the block of NVM;
comparing the read count with a first threshold when it is identified that the block is a PPB; and
when identified otherwise, comparing the read count with a second threshold, wherein the first threshold is smaller than the second threshold.

29. The article of manufacture of claim 28, wherein the machine readable storage medium includes further processor executable instructions that when executed cause the processor to perform a method comprising:
incrementing the read count when the read count is less than the first threshold; and
classifying the PPB as a fully programmed block (FPB) when the read count is greater than the first threshold, wherein classifying the PPB as a FPB comprises closing write access to the PPB.

30. The article of manufacture of claim 28, wherein the machine readable storage medium includes further processor executable instructions that when executed cause the processor to perform a method comprising:
incrementing the read count when the read count is less than the second threshold; and
relocating the block to a new location when the read count is greater than the second threshold.

* * * * *